United States Patent
Tu et al.

(10) Patent No.: US 7,705,758 B2
(45) Date of Patent: Apr. 27, 2010

(54) METHOD AND APPARATUS FOR DIGITAL TO ANALOG CONVERSION

(75) Inventors: Wei-Hsuan Tu, Hsinchu (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/052,023

(22) Filed: Mar. 20, 2008

(65) Prior Publication Data

US 2009/0237283 A1 Sep. 24, 2009

(51) Int. Cl.
*H03M 3/00* (2006.01)

(52) U.S. Cl. .......... 341/143; 341/144

(58) Field of Classification Search .......... 341/143, 341/144, 145
See application file for complete search history.

(56) References Cited

U.S. PATENT DOCUMENTS

| | | | |
|---|---|---|---|
| 4,868,421 A * | 9/1989 | Herndon et al. | 326/110 |
| 5,323,157 A | 6/1994 | Ledzius et al. | |
| 5,585,802 A | 12/1996 | Cabler et al. | |
| 7,256,720 B2 * | 8/2007 | Fukuda | 341/143 |
| 7,345,608 B2 * | 3/2008 | Tu et al. | 341/143 |
| 7,501,966 B2 * | 3/2009 | Chung et al. | 341/136 |
| 2002/0149503 A1 * | 10/2002 | Lautzenhiser | 341/17 |
| 2004/0149910 A1 * | 8/2004 | Hatatani et al. | 250/338.3 |
| 2007/0069933 A1 * | 3/2007 | Clara et al. | 341/143 |

* cited by examiner

*Primary Examiner*—Rexford N Barnie
*Assistant Examiner*—Joseph Lauture
(74) *Attorney, Agent, or Firm*—Thomas, Kayden, Horstemeyer & Risley

(57) ABSTRACT

A Delta-Sigma DAC and a digital to analog conversion method are provided. A FIR filter receives a shaped digital signal to generate a first current on a first output node, and a second current on a second output node. A current inverter is coupled to the second output node, outputting a reversed current having opposite polarity and identical magnitude of the second current. A current to voltage converter is coupled to the first output node and the output of current inverter, generating an analog signal according to the first and reversed currents. A first current source compensates DC offset for the first current, and a second current source compensates DC offset for the second current. The first and second current sources are implemented by NMOS.

11 Claims, 6 Drawing Sheets

METHOD AND APPARATUS FOR DIGITAL TO ANALOG CONVERSION

BACKGROUND OF THE INVENTION

1. Field of the Invention

The invention relates to audio devices, and in particular, to a Delta-Sigma DAC outputting audio signals.

2. Description of the Related Art

FIG. 1 shows a conventional Delta-Sigma DAC for converting a 16-bit digital signal to an analog audio signal Vout. The Delta-Sigma technique is popular because it achieves high resolution and quality with effective hardware implementations. A typical Delta-Sigma DAC comprises an interpolator 110, a Delta-Sigma modulator 120 and a FIR filter 130. The interpolator 110 receives an n-bit digital signal at a first sampling rate, and performs an interpolation to generate an n-bit output signal at a second, higher sampling rate. The Delta-Sigma modulator 120 receives the output signal from interpolator 110 and shapes the quantization noises therein, thereby generating a shaped signal as a substantially linear analog representation of the 16-bit digital signal within a pass band. The FIR filter 130 then filters the shaped signal to eliminate out-of-band high frequency noises, and generates the analog audio signal Vout. The FIR filter 130 typically comprises a shift register 132 comprising a plurality of delay units 134, a plurality of weighting units 136 corresponding to each delay units 134, and a summing device 138 coupled to the outputs of weighting units 136. The shaped signal is serially delayed by the delay units 134. The weighting units 136 jointly serve as a weighting function to leverage the outputs from each delay units 134, and the summing device 138 sums the outputs from weighting units 136 to generate the analog audio signal Vout.

FIG. 2 shows a conventional FIR filter 200. A plurality of current sinks 204 are provided, each providing a different current as a weighting coefficient. A plurality of switches 202 direct the currents to a node A or a node B according to corresponding values output from the delay units 134. In this way, a first current Ia and a second current Ib are respectively formed on the node A and node B, representing the audio signal as a differential current pair. The current source 206 and current source 208 compensate the current offsets on the nodes A and B, thus, the first current Ia and second current Ib are bidirectional. The current to voltage converters 210 and 220, driven by a reference voltage Vref, then convert the first current Ia and second current Ib to a first voltage Va and a second voltage Vb, and the subtracter 230 subtracts the first voltage Va and second voltage Vb to obtain the analog audio signal Vout. Conventionally, four OP amplifiers (not shown) are required to implement the reference voltage Vref, current to voltage converter 210, current to voltage converter 220 and subtracter 230. The OP amplifiers dominate area consumption in a chip, and contribute 1/f noises that induce SNR performance hits. An implementation requiring less OP amplifiers is therefore desirable.

BRIEF SUMMARY OF THE INVENTION

A detailed description is given in the following embodiments with reference to the accompanying drawings.

An exemplary embodiment of a Delta-Sigma DAC is provided, in which a FIR filter receives a shaped digital signal to generate a first current on a first output node, and a second current on a second output node. A current inverter is coupled to the second output node, outputting a reversed current having opposite polarity and identical magnitude of the second current. A current to voltage converter is coupled to the first output node and the output of current inverter, generating an analog audio signal according to the first and reversed currents. A first current source compensates DC offset for the first current, and a second current source compensates DC offset for the second current. The first and second current sources are implemented by NMOS.

The FIR filter comprises a shift register, a plurality of weighting units and a plurality of switches. The shift register comprises a plurality of delay units, serially delaying the shaped digital signal. The weighting units, each corresponding to a delay unit, are programmable to provide various currents individually. The switches each correspondingly couple to a delay unit and a weighting unit, directing the currents from weighting units to the first output node or the second output node according to output of the corresponding delay units, whereby the total currents directed to the first output node form the first current, and the second output node the second current.

The weighting units comprise a first PMOS having a source coupled to power supply, and a gate coupled to first control signal, and a second PMOS having a source coupled to the drain of first PMOS, a gate coupled to second control signal, and a drain coupled to the corresponding switch.

The current inverter comprises a first amplifier, a first resistor and a second register. The first amplifier has a first input terminal receiving the second current, a second input terminal coupled to a reference voltage, and an output terminal. The second resistor is coupled to the first input terminal and the output terminal. The first resistor is coupled to the output terminal, outputting the reversed current.

The current to voltage converter comprises a second amplifier having a first input terminal receiving the first and reversed currents, a second input terminal coupled to a reference voltage, and an output terminal outputting the analog audio signal; and a capacitor and a third resistor in parallel coupled to the first input terminal and the output terminal.

A digital to analog conversion method implemented by the Delta-Sigma DAC is also provided. An n-bit digital signal is provided and over-sampled to generate an n-bit over-sampled digital signal. The n-bit over-sampled digital signal is shaped to generate a shaped digital signal. The shaped digital signal is then filtered with a FIR filter to generate a first current and a second current. A reversed current having opposite polarity and identical magnitude of the second current is generated. An analog audio signal is generated according to the first and reversed currents.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
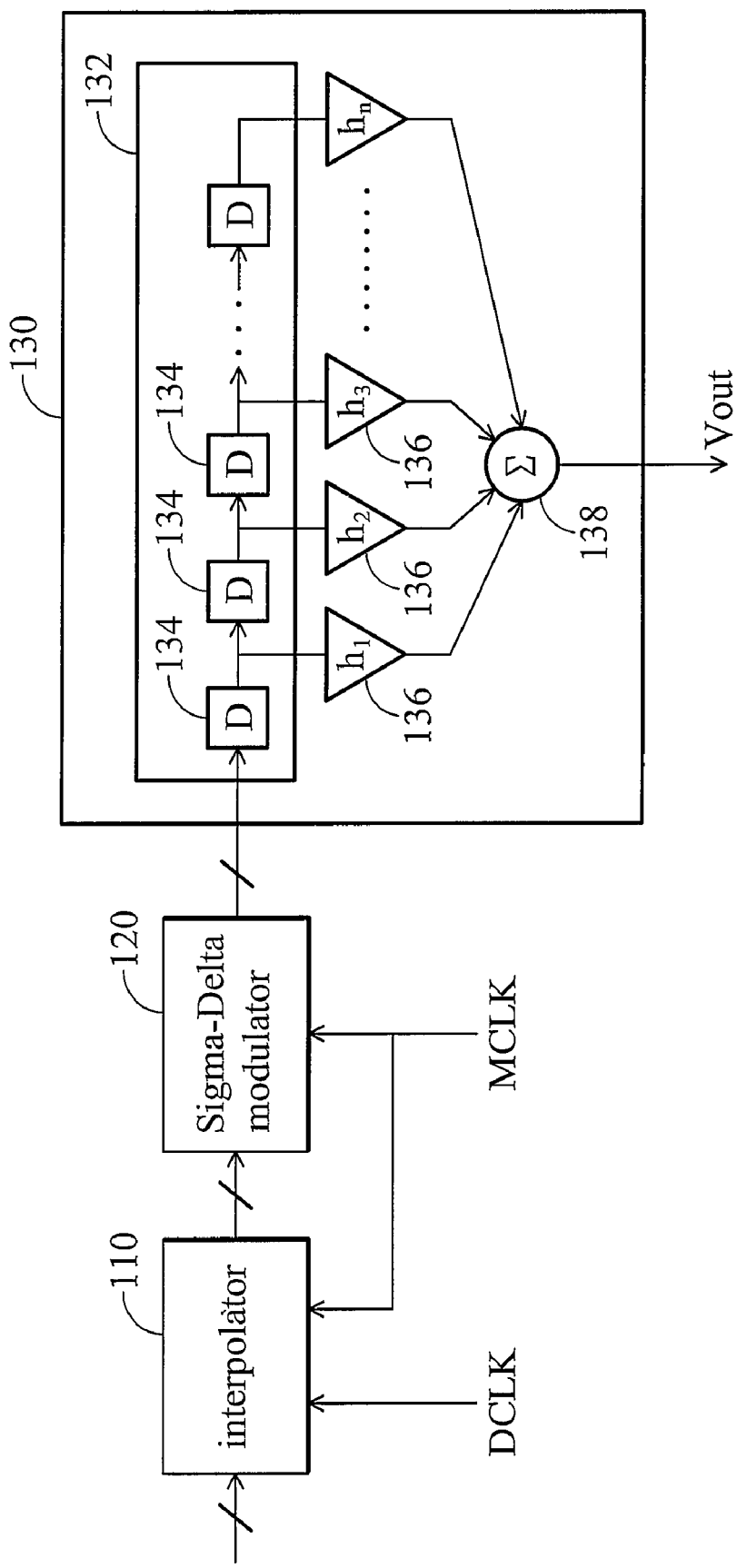
FIG. 1 shows a conventional Delta-Sigma DAC.
Figure 2:
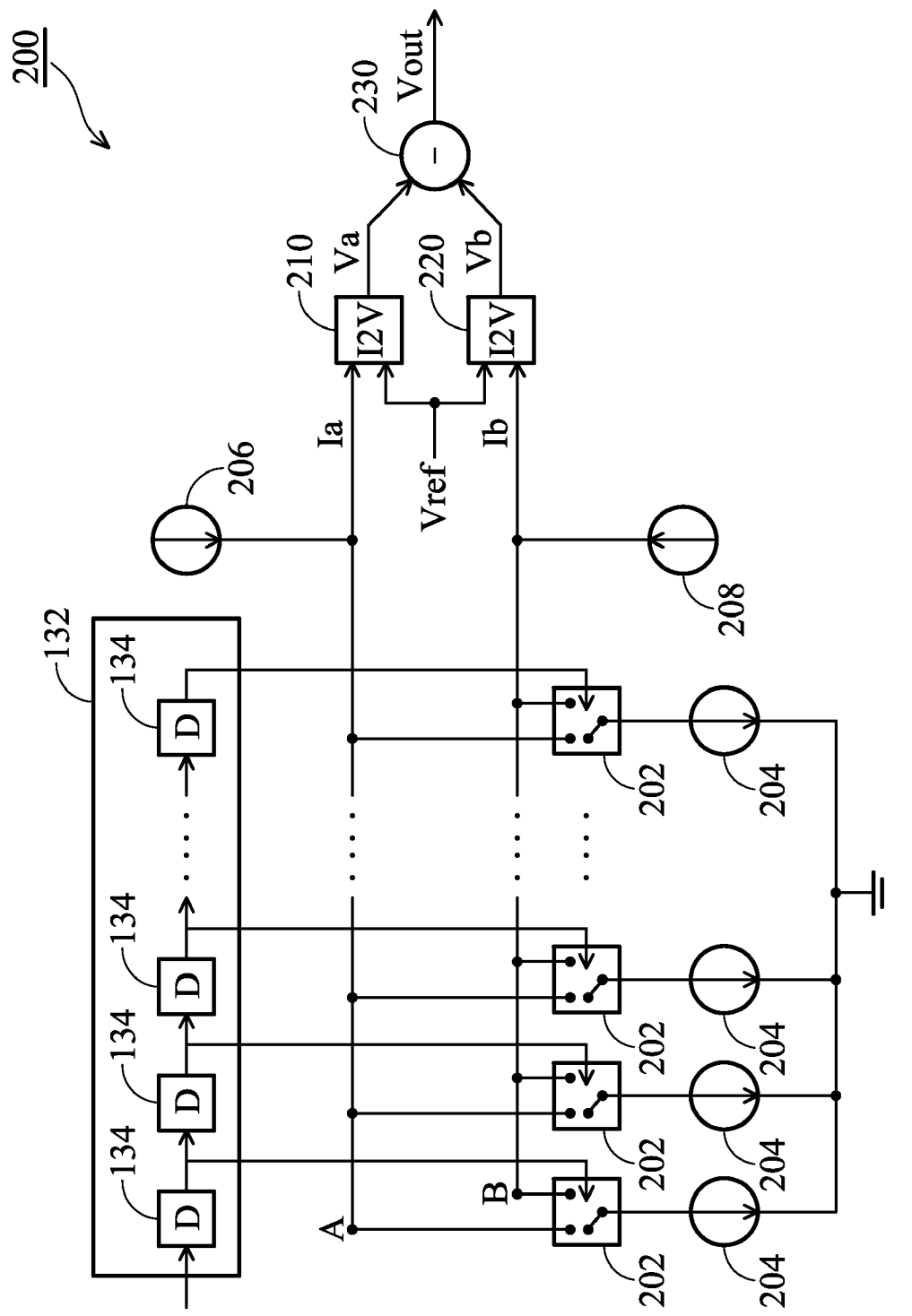
FIG. 2 shows a conventional FIR filter 200.
Figure 3:
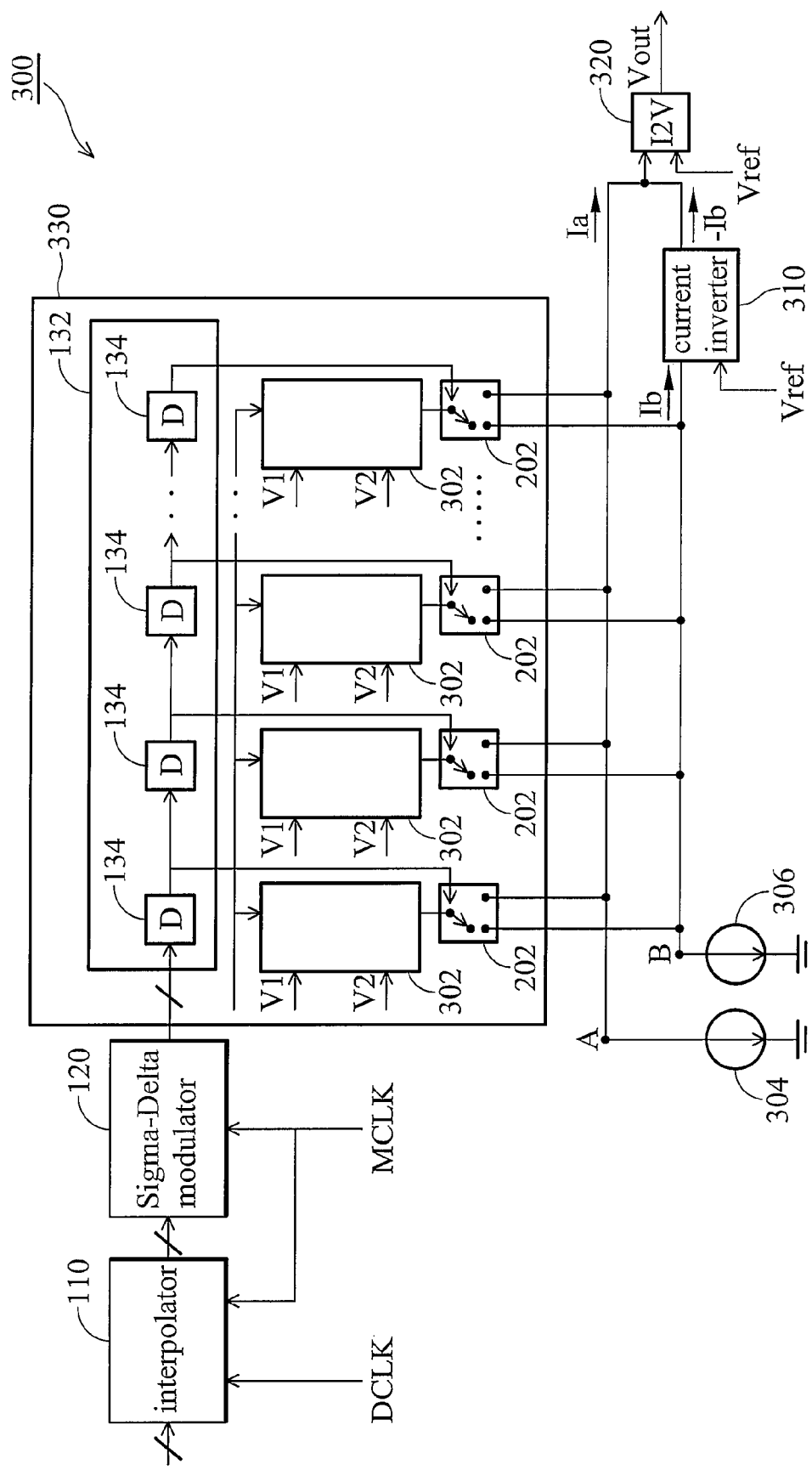
FIG. 3 shows an embodiment of a Delta-Sigma DAC.

FIG. 3 shows an embodiment of a Delta-Sigma DAC 300. The Delta-Sigma DAC 300 comprises a FIR filter 330, a current inverter 310, and a current to voltage converter 320. The FIR filter 330 receives a shaped digital signal to generate a first current Ia on a node A, and a second current Ib on a node B. The current inverter 310 is coupled to the node B, outputting a reversed current −Ib having opposite polarity and identical magnitude of the second current Ib. The current to voltage converter 320 is coupled to the node A and the output of current inverter 310, generating an analog audio signal according to the first and reversed currents. A first current source 304 is coupled to the node A, compensating DC offset for the first current Ia, and a second current source 306 is coupled to the node B, compensating DC offset for the second current Ib. The Delta-Sigma DAC 300 also comprises a interpolator 110 over-sampling a n-bit digital signal to generate a n-bit over-sampled signal, and a Delta-Sigma modulator 120 coupled to the output of interpolator 110, shaping the n-bit over-sampled digital signal to generate the shaped digital signal for the shift register 132.

In FIG. 3, the FIR filter 330 comprises a shift register 132, a plurality of weighting units 302, and a plurality of switches 202. The shift register 132 comprises a plurality of delay units 134, serially delaying the shaped digital signal. The weighting units 302 each correspond to a delay unit 134, programmable to provide various currents that function as weighing coefficients for the filtering. Each switch 202 is correspondingly coupled to a delay unit 134 and a weighting units 302, directing the currents from weighting units 302 to the node A or the node B according to outputs of the corresponding delay units 134, whereby the total currents directed to the node A form the first current Ia, and the node B the second current Ib. The switches 202 may be implemented by PMOS or NMOS operating in saturation or linear region.

Figure 4A:
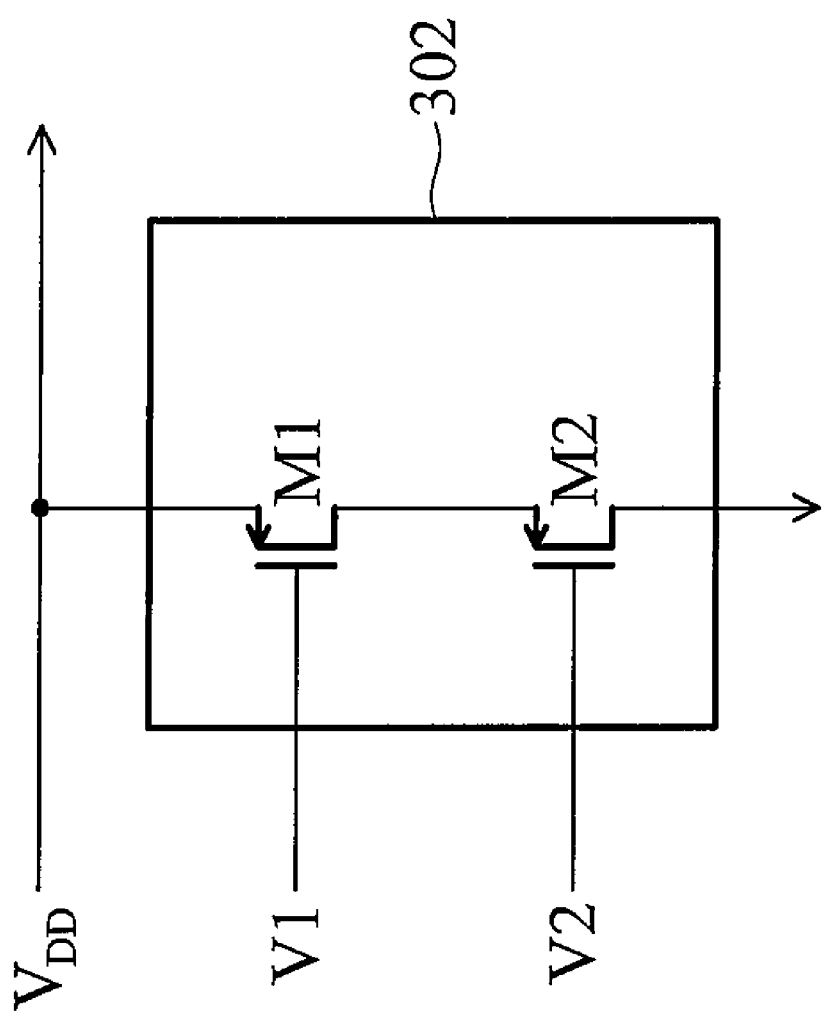
FIG. 4a shows an embodiment of the weighting units 302 according to FIG. 3.

FIG. 4a shows an embodiment of the weighting units 302 according to FIG. 3, comprising a first PMOS M1 and a second PMOS M2. The first PMOS M1 has a source coupled to power supply $V_{DD}$, and a gate coupled to first control signal V1. The second PMOS M2 has a source coupled to the drain of first PMOS M1, a gate coupled to second control signal V2, and a drain coupled to the corresponding switches 202. The weighting units 302 utilizing PMOS benefit from lower 1/f noise than NMOS, and the area consumed is also effective. The weighting units 302 are arranged in parallel, rendering less influence by the channel length modulation on the THD.

Figure 4B:
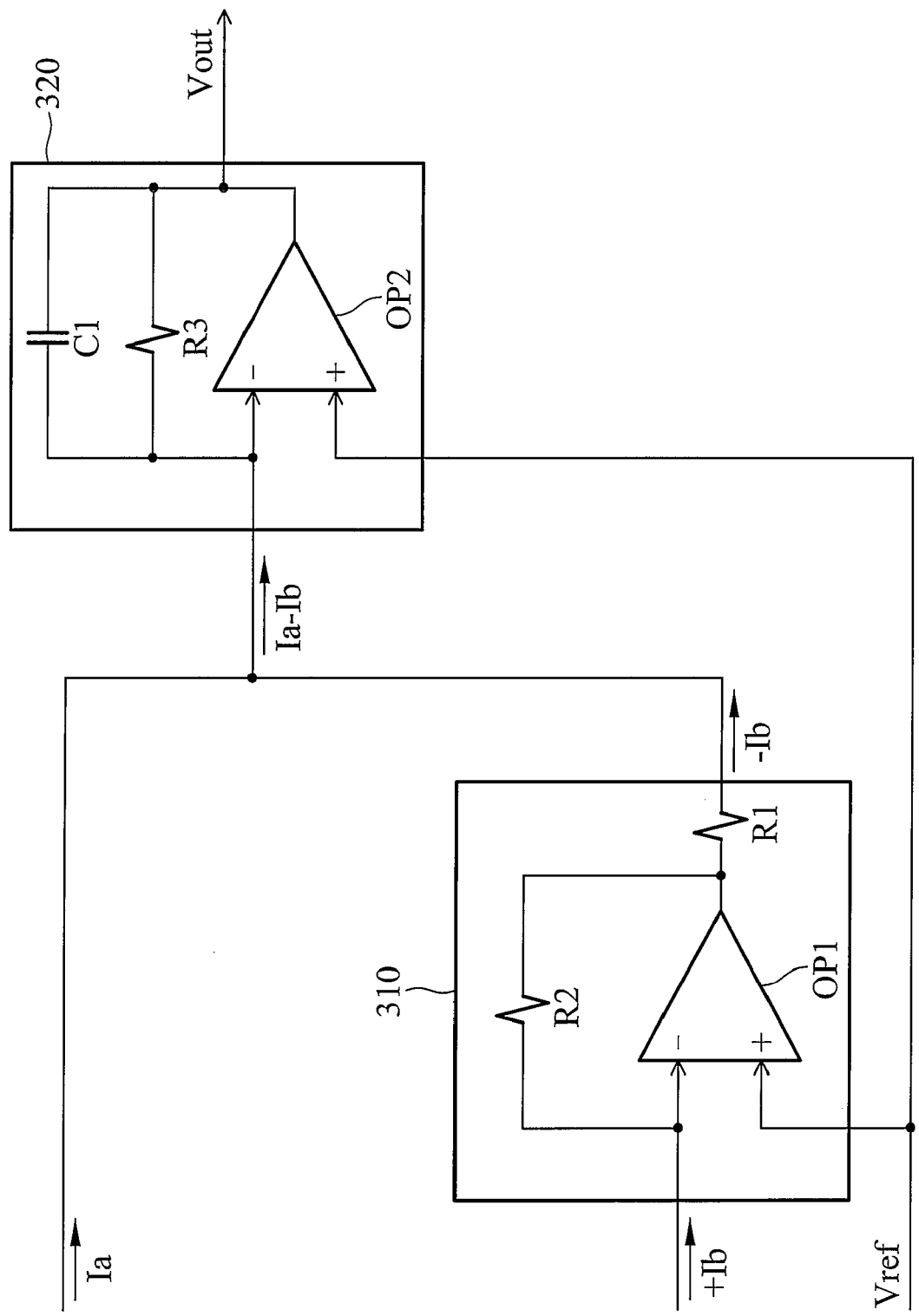
FIG. 4b shows an embodiment of the current inverter 310 an current to voltage converter 320 according to FIG. 3.

FIG. 4b shows an embodiment of the current inverter 310 and current to voltage converter 320 according to FIG. 3. The current inverter 310 comprises a first amplifier OP1, a second resistor R2 and a first resistor R1. The first amplifier OP1 has a first input terminal receiving the second current Ib, a second input terminal coupled to a reference voltage Vref, and an output terminal. The second resistor R2 is coupled to the first input terminal and the output terminal. The first resistor R1 is coupled to the output terminal, outputting the reversed current −Ib. The current to voltage converter 320 comprises a second amplifier OP2, a capacitor C1 and a third resistor R3. The second amplifier OP2 has a first input terminal receiving the first and reversed currents, a second input terminal coupled to a reference voltage Vref, and an output terminal outputting the analog audio signal. The capacitor C1 and third resistor R3 are coupled in parallel to the first input terminal and the output terminal. The first current Ia and reversed current −Ib are sent to the input terminal of the second amplifier OP2, wire summing to generate a current first current Ia-Ib. Since the reference voltage Vref provided to the current inverter 310 and current to voltage converter 320 does not drive any resistive loading, no additional OP amplifier is required for implementation thereof. Thus, only a total of two OP amplifiers are required to implement the current inverter 310 and current to voltage converter 320, and the total area required is significantly reduced. The 1/f noise generated by the OP amplifiers is also reduced, yielding better SNR performance. In the current to voltage converter 320, however, the capacitor C1 may be the only loading that the reference voltage Vref needs to drive, so the reference voltage Vref can be implemented by a band-gap circuit with voltage division or resistor-current multiplication. The power supply rejection ratio (PSRR) of the reference voltage Vref can be reduced by utilizing the band-gap circuit.

Figure 5:
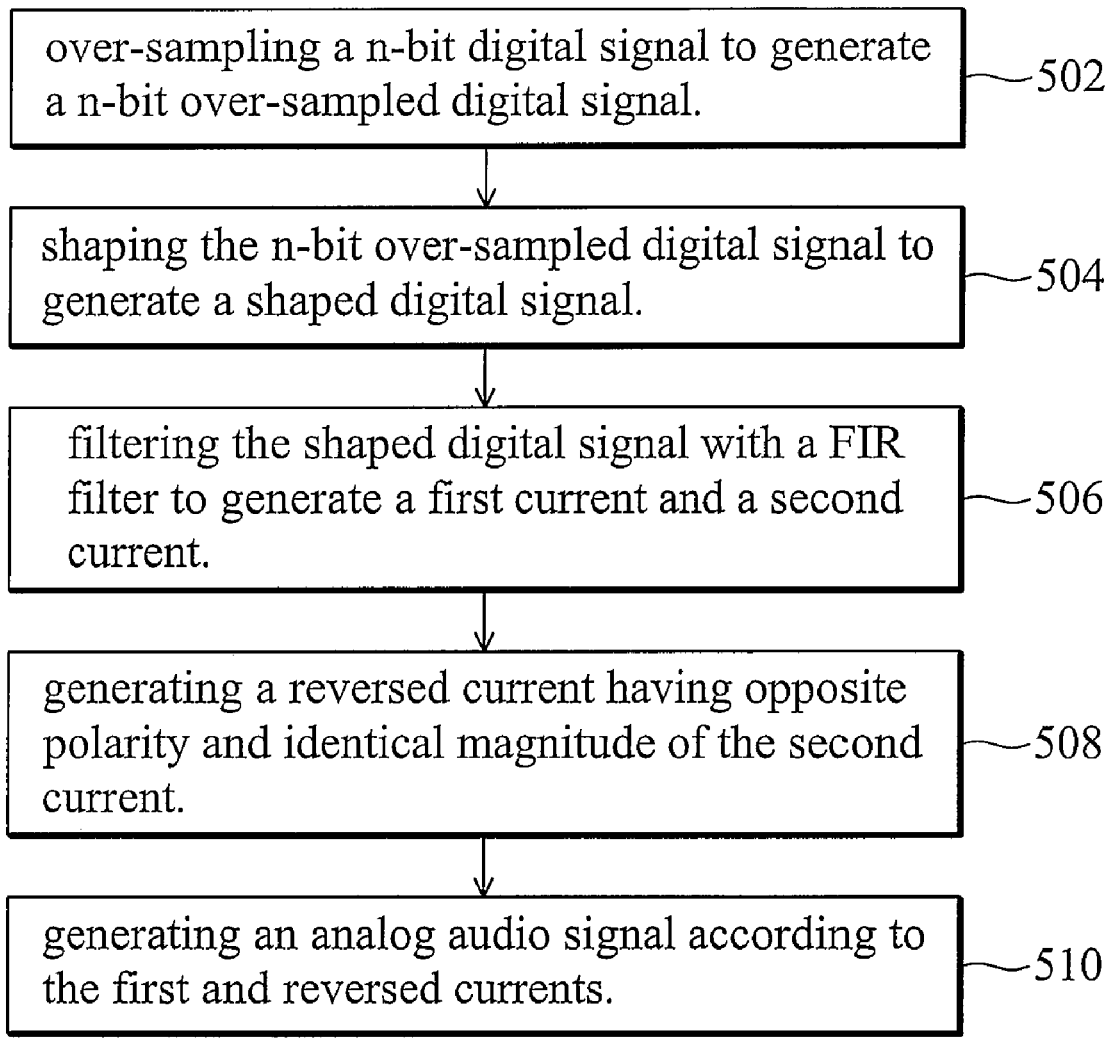
FIG. 5 is a flowchart of the digital to analog conversion method.

FIG. 5 is a flowchart of the digital to analog conversion method. In step 502, an n-bit digital signal is over-sampled to generate an n-bit over-sampled digital signal. In step 504, the n-bit over-sampled digital signal is shaped to generate a shaped digital signal. In step 506, the shaped digital signal is filtered with a FIR filter to generate a first current and a second current. Specifically, the shaped digital signal is serially delayed in a shift register. A plurality of varied currents corresponding to each delayed shaped digital signal are provided. The currents are individually directed to a first output node or a second output node according to each delayed shaped digital signal, whereby the total currents directed to the first output node form the first current, and the second output node the second current. DC offsets in the first and second currents are compensated. In step 508, a reversed current having opposite polarity and identical magnitude of the second current is generated. In step 510, an analog audio signal is generated according to the first and reversed currents. The first and reversed currents are summed by wire summing, and the sum is converted to the analog audio signal. The analog audio signal is of a voltage form.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A Delta-Sigma Digital to Analog Converter (DAC), comprising:
   a Delta-Sigma modulator, receiving an over-sampled digital signal and generating a shaped digital signal; and
   a Finite Impulse Response (FIR) filter, comprising:
      a weighted current generation unit, receiving the shaped digital signal and generating a first current on a first output node and a second current on a second output node;
      a current inverter, coupled to the second output node, the current inverter outputting a reversed current, wherein the reversed current has opposite polarity of the second current; and
      a current to voltage converter, coupled to the first output node and the output of the current inverter, the current to voltage converter generating an analog signal according to the first and reversed currents.

2. The Delta-Sigma DAC as claimed in claim 1, further comprising:
   a first current source, compensating DC offset for the first current; and a second current source, compensating DC offset for the second current;
  wherein the first and second current sources are implemented by NMOS.

3. The Delta-Sigma DAC as claimed in claim 1, wherein the weighted current generation unit comprises:
  a shift register comprising a plurality of delay units, serially delaying the shaped digital signal;
  a plurality of weighting units each corresponding to a delay unit, programmable to provide various currents individually; and
  a plurality of switches, each correspondingly coupled to a delay unit and a weighting unit, directing the currents from weighting units to the first output node or the second output node according to outputs of the corresponding delay units, whereby the total currents directed to the first output node form the first current, and the second output node the second current.

4. The Delta-Sigma DAC as claimed in claim 3, wherein each weighting unit comprises:
  a first P-type Metal-Oxide Simi-conductor (PMOS), having a source coupled to power supply, and a gate coupled to first control signal; and
  a second PMOS, having a source coupled to the drain of first PMOS, a gate coupled to second control signal, and a drain coupled to the corresponding switch.

5. The Delta-Sigma DAC as claimed in claim 1, wherein the current inverter comprises:
  a first amplifier having a first input terminal receiving the second current, a second input terminal coupled to a reference voltage, and an output terminal;
  a second resistor coupled to the first input terminal and the output terminal; and
  a first resistor coupled to the output terminal, outputting the reversed current.

6. The Delta-Sigma DAC as claimed in claim 1, wherein the current to voltage converter comprises:
  a second amplifier having a first input terminal receiving the first and reversed currents, a second input terminal coupled to a reference voltage, and an output terminal outputting the analog signal; and
  a capacitor and a third resistor parallel coupled to the first input terminal and the output terminal.

7. The Delta-Sigma DAC as claimed in claim 1, further comprising:
  an interpolator, providing an n-bit over-sampled digital signal to the Delta-Sigma modulator.

8. A digital to analog conversion method, comprising:
  providing an n-bit digital signal;
  over-sampling the n-bit digital signal to generate an n-bit over-sampled digital signal;
  shaping the n-bit over-sampled digital signal to generate a shaped digital signal; and
  filtering the shaped digital signal with a Finite Impulse Response (FIR) filter to generate an analog signal;
  wherein the step of filtering further comprises:
  receiving the shaped digital signal and generating a first current and a second current;
  generating a reversed current having opposite polarity of the second current; and
  generating the analog signal according to the first and reversed currents.

9. The digital to analog conversion method as claimed in claim 8, wherein the filtering further comprises:
  serially delaying the shaped digital signal;
  providing a plurality of varied currents corresponding to each delayed shaped digital signal; and
  directing the varied currents to a first output node or a second output node according to each delayed shaped digital signal, whereby the total currents directed to the first output node form the first current, and the second output node the second current.

10. The digital to analog conversion method as claimed in claim 8, further comprising compensating Direct Current (DC) offset for the first and second currents.

11. The digital to analog conversion method as claimed in claim 8, wherein the analog signal generation comprises:
  summing the first and reversed currents; and
  converting the sum of the first and reversed currents to the analog signal;
  wherein the analog signal is of a voltage form.

* * * * *